United States Patent [19]
Palmer

[11] Patent Number: 5,581,626
[45] Date of Patent: Dec. 3, 1996

[54] AUTOMATICALLY SWITCHED EQUALIZATION CIRCUIT

[75] Inventor: Daniel A. Palmer, Semi Valley, Calif.

[73] Assignee: Harman International Industries, Inc., Northridge, Calif.

[21] Appl. No.: 509,160

[22] Filed: Jul. 31, 1995

[51] Int. Cl.[6] .................................................... H03G 5/00
[52] U.S. Cl. ........................................ 381/103; 381/123
[58] Field of Search ................................ 381/102, 103, 381/123, 120, 25, 74, 98, 27

[56] References Cited

U.S. PATENT DOCUMENTS

| | | | |
|---|---|---|---|
| 4,433,209 | 2/1984 | Kurosawa et al. | 381/25 |
| 4,763,012 | 8/1988 | Blankenship | 381/123 |
| 4,949,384 | 8/1990 | Noro et al. | 381/123 |
| 5,050,214 | 9/1991 | Lee | 381/74 |
| 5,056,148 | 10/1991 | Hayashi | 381/25 |
| 5,161,198 | 11/1992 | Noble | 381/123 |

*Primary Examiner*—Forester W. Isen
*Attorney, Agent, or Firm*—Jones, Day, Reavis & Pogue

[57] ABSTRACT

A circuit in which, when loudspeakers are being used by themselves, the equalization to the loudspeakers is optimized for full range operation and only the intended filters for full range operation are inserted into the circuit path. When a subwoofer is added to the system to handle low frequencies, the subwoofer mating connector is inserted into a connector jack to receive the audio signals and simultaneously inserts high pass filters into the circuit for the speakers so they operate in the mid range and high frequency range where they are better suited. The subwoofer handles and reproduces the low frequencies. The result is louder and clearer satellite speakers that exhibit a much lower tendency to clip the signals from the amplifier driving them.

16 Claims, 1 Drawing Sheet

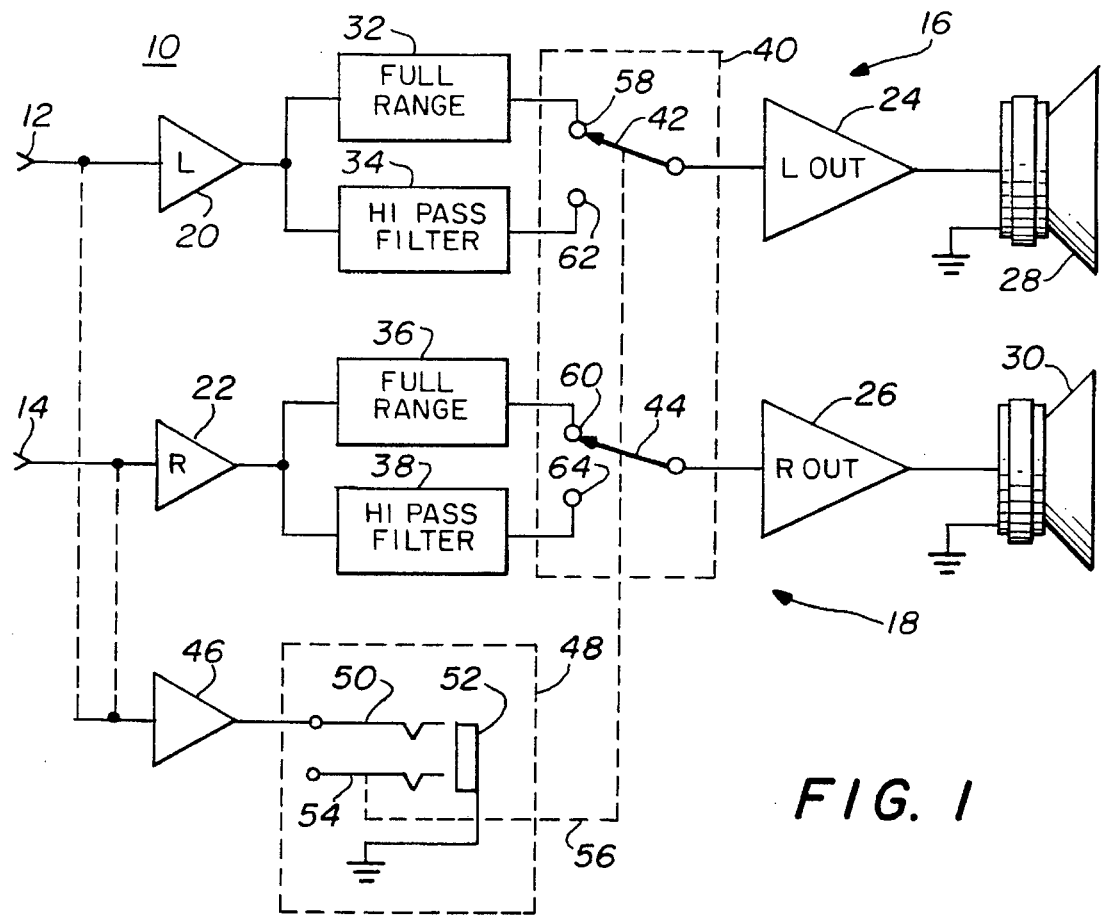
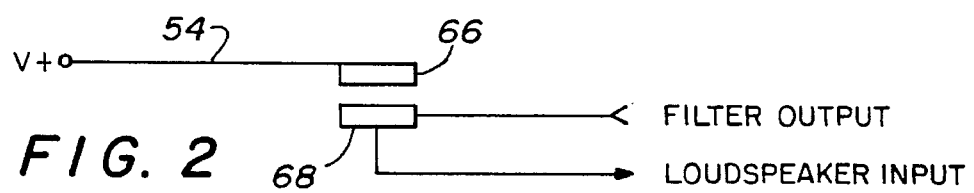
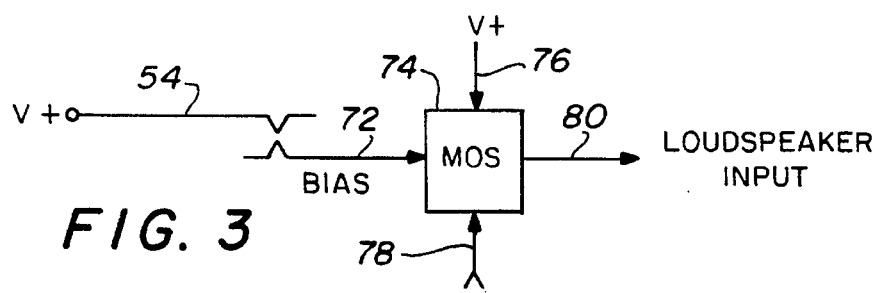
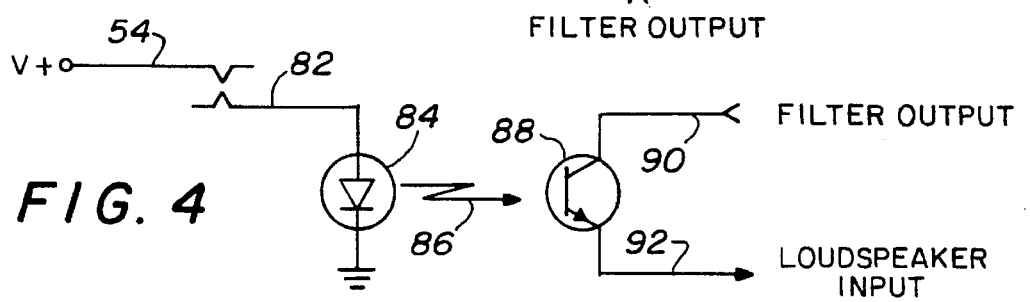

AUTOMATICALLY SWITCHED EQUALIZATION CIRCUIT

BACKGROUND OF THE INVENTION

1. Field of the Invention

The present invention relates to equalization circuits in general and in particular to a circuit that enables the equalization of loudspeakers to be automatically switched when an optional subwoofer is added to an entry level two-speaker audio system.

2. Description of Related Art

When a pair of loudspeakers are designed for listening to music or any other program material, the equalization to those speakers is normally optimized for full range frequency operation, commonly 20 Hz–20 kHz. Active and/or passive filters are required to obtain flat frequency response for full range operation and these types of filters are commonly used in loudspeaker systems to correct for non-uniform frequency response. Transducers which are small and inefficient are not optimum for low frequency operation; however, due to cost considerations and/or lack of available space inside smaller loudspeaker enclosures (such as multimedia speakers), these small transducers are commonly used despite their relatively poor ability to reproduce low frequencies and despite limited power handling capacity. A 2.5 to 3 inch diameter transducer, for example, may only be effective down to 200 to 300 Hz, whereas typical program material extends down to approximately 20 Hz. These smaller transducers are better suited as satellite speakers for handling mid to high frequency program material.

When a subwoofer is added to a loudspeaker system, the low frequency information in the program material will be handled by the subwoofer; however, if the smaller, less efficient transducers are still subjected to those same low frequencies and high excursion, they needlessly labor to reproduce low frequencies, consuming excess power, causing the speaker to distort and causing the sound quality to be less than optimum. The system is not smart enough to know that the subwoofer has been connected. Thus, in the prior art, if a subwoofer is desired to be added to the system, a manually operated switch or switches must be used to change filters that are connected to the left and right speakers and to route any signals to the subwoofer.

SUMMARY OF THE INVENTION

In the present invention, when an electrical connector is inserted into the subwoofer output jack, the insertion is sensed and automatically causes the necessary switches to be operated. The activation of the switching means causes the low frequency drive to the smaller satellite speakers to be substantially reduced. This allows the satellite speakers (which are normally quite small and tend to be weak at low frequencies) to operate in the mid range and high frequency range for which they are best suited. In doing this, the power dissipation in the smaller satellite speakers is reduced dramatically due to the fact that they are no longer required to reproduce the low frequencies that are being fed to the subwoofer. In many cases this is critical since a low-cost, low-current wall transformer is typically used to power the satellite amplifiers and therefore provides a limited supply voltage and current. Due to the loading of the power supply when the amplifier reproduces low frequencies, the available output power for mid and high frequencies is substantially diminished thus causing distortion at all frequencies and inefficient use of the power supply. The result of the present invention is louder and clearer sounding satellite speakers exhibiting a much lower tendency to clip the amplifier signals driving them due to a significant decrease in low frequencies.

In the present invention, a stereo minijack with a DPDT switch is used at the subwoofer output jack or connector. When the subwoofer output jack or connector is unused (no plug inserted), the audio signal is caused by the DPDT switch in the jack to be routed such that full range frequencies are fed to the amplifier output sections and thence to the satellite loudspeakers. When the subwoofer output jack is used (plug inserted), the audio signal is caused by the DPDT switch in the jack to be routed such that only mid range and high frequencies are fed to the amplifier output sections and satellite speakers. The amplifiers and power supply for the satellite speakers are no longer subject to the low frequencies which will now be reproduced by the subwoofer through the plug inserted in the output jack.

Thus, in one condition, when the satellite speakers are being used by themselves, the equalization to the satellite speakers is optimized for full range operation and only the intended filters for full range operation are inserted into the circuit path.

In the second state, when a subwoofer is added to the system and has a connector inserted into the subwoofer output jack, a switch integrated into the subwoofer output jack causes the signals to be rerouted to appropriate filters that move the corner frequency of the high pass filters (−3 dB point) out to a higher frequency. As stated previously, this allows the satellite speakers (which are normally quite small and tend to be weak at low frequencies) to operate in the mid range and high frequency range where they are better suited. Thus, the power dissipation in the smaller satellite speakers is dramatically reduced due to the fact that they are no longer required to reproduce the low frequencies which are fed to the subwoofer that has been added to the system. As stated, the result is a louder and clearer sound from the satellite speakers because they exhibit a much lower tendency to clip the signals from the amplifier driving them.

Thus it is an object of the present invention to provide an automatically switched equalization circuit that allows full range frequency audio signals to be coupled to a loudspeaker and which automatically couples only mid and high frequency range audio signals to the loudspeaker when a woofer or low frequency audio loudspeaker is connected to the system.

It is another object of the present invention to use an automatically switched equalization circuit with left and right audio channel loudspeakers.

It is still another object of the present invention to modify an audio loudspeaker system utilizing a pair of mid and high frequency range speakers by adding a low frequency range speaker that automatically disconnects low frequency range signals from said pair of mid range to high frequency range speakers.

Thus the present invention relates to an automatically switched equalization circuit for an audio loudspeaker of the mid and high frequency ranges including audio input signals, a jack for receiving a connector that couples the audio signals to a low frequency range loudspeaker, a switch associated with the jack having first and second positions, the first position of the switch coupling a full frequency range audio signal to the audio loudspeaker, the second position of the switch coupling a mid frequency range and high frequency range audio signal to the audio loudspeaker and the switch being in the first position when the low frequency range loudspeaker is unused and being in the second position when the low frequency range loudspeaker is used and the connector is inserted in the jack.

BRIEF DESCRIPTION OF THE DRAWINGS

These and other features of the present invention will be more fully disclosed when taken in conjunction with the following DETAILED DESCRIPTION OF THE DRAWINGS in which like numerals represent like elements and in which:

FIG. 1 is a schematic diagram of the novel automatically switched equalization circuit;

FIG. 2 is a schematic arrangement of a Hall effect switch that can be used as the switch that provides the automatic switching of the equalization circuit;

FIG. 3 is a general diagram illustrating the use of an electronic device as the switch for providing the automatic equalization; and FIG. 4 is a schematic arrangement of an optical device that can be used as the switch to provide the automatic equalization.

DETAILED DESCRIPTION OF THE PRESENT INVENTION

A two speaker audio system 10 is shown in FIG. 1 and has audio inputs 12 and 14 feeding two channels 16 and 18 which may be left and right channels for the two-speaker system. The invention, however, would work with a single speaker as will be seen hereafter. Each of the left and right channels 16 and 18 has an input amplifier 20 and 22, respectively. They also have respective output amplifiers 24 and 26 which drive the respective speakers 28 and 30. The audio signals, after being amplified by amplifiers 20 and 22 in each of the channels 16 and 18, are coupled to full range filters 32 and 36, respectively. A switching unit 40 has a switch 42 in the left channel that is coupled to output terminal 58 of the full range filter 32 and couples the full range audio signals to amplifier 24 and thence to speaker 28. In like manner, in the right channel 18, the output of amplifier 22 is coupled to full range filter 36 whose output on terminal 60 is coupled through switch 44 to amplifier 26 that drives speaker 30. It is to be understood that when a pair of loudspeakers such as 28 and 30 in FIG. 1 are designed for listening to music or any other program material, the equalization to those speakers is normally optimized for the full frequency range operation which is commonly 20 Hz–20 kHz. The full range filters 32 and 34 are required to obtain flat frequency response in the full range operation and these types of filters are commonly used in loudspeaker systems to correct for non-uniform frequency response. Transducers that are small and inefficient, and typically forming the loudspeakers 28 and 30, are not optimum for low frequency operation. However, due to cost considerations and/or lack of available space inside smaller loudspeaker enclosures, these small transducers are commonly used despite their relatively poor ability to reproduce low frequencies and despite limited power handling capacity. Such a speaker may be a 2.5–3 inch diameter transducer and may be effective only down to 200–300 Hz whereas typical program material extends down to approximately 20 Hz. Thus these smaller transducers 28 and 30 are better suited as satellite speakers for handling mid to high frequency program material. As defined herein, mid to high frequency program material is intended to mean the range of 200–20 kHz generally and in the preferred range of 300 Hz to 20 kHz.

If it is decided to add a subwoofer to the loudspeaker system, such subwoofer would handle frequencies from 20 Hz–300 Hz, the low frequency information in the program material. However, if the smaller, less efficient transducers 28 and 30 are still subjected to these same low frequencies and high excursion, they needlessly labor to reproduce low frequencies, consume excess power, distort the audio signals, and cause the sound quality to be less than optimum. The system is not smart enough to know that the subwoofer has been added to the system.

In the present invention, if a subwoofer is desired to be added, a jack 48, which may be a stereo minijack, is coupled to the output of an amplifier 46 whose inputs are coupled to the audio sources 12 and 14. When a connector for the subwoofer is inserted into the output jack 48, it makes contact with terminals 50 and 52 to receive the audio frequency signals. It will be sensitive primarily to the low frequency signals 20 Hz–300 Hz because of its construction. However the insertion of the connector into the jack 48 is sensed by a second arm 54 that is mechanically coupled to switches 42 and 44. Switches 42 and 44 are caused to move from their connection to output terminals 58 and 60 of the full range filters 32 and 36 to the output terminals 62 and 64 of the respective high pass filters 34 and 38. This allows the satellite speakers 28 and 30 (which, as stated previously, are normally quite small and tend to be weak at low frequencies) to operate in the mid range and high frequency range (300 Hz–20 kHz) for which they are better suited. In doing this the power dissipation in the smaller satellites 28 and 30 is reduced dramatically due to the fact that they no longer are required to attempt to reproduce the low frequencies now being fed to the subwoofer coupled to jack 48. In many cases, this is critical since a low-cost, low-current wall transformer is typically used to power the satellite amplifiers and headroom in the enclosure is at a premium. The result of this automatic switching scheme therefore is louder and clearer sounding satellite speakers 28 and 30 that exhibit a much lower tendency to clip the amplifier signals from amplifiers 24 and 26 that drive them because there is a significant decrease in low frequencies coupled to the loudspeakers 28 and 30.

Thus, when the subwoofer output jack 48 is unused, that is, no plug is inserted therein, the audio signal is routed through the switches 42 and 44 such that full range frequencies from filters 32 and 36 are fed to the amplifier output sections 24 and 26 and thence to the satellite loudspeakers 28 and 30.

When the subwoofer output jack 48 is used and a plug or connector is inserted therein, switches 42 and 44 are then activated to cause the audio signal to be routed through the switches 42 and 44 such that only mid range and high frequencies (300 Hz–20 kHz) from high pass filters 34 and 38, respectively, are fed through the amplifier output sections 24 and 26 and thence to the satellite speakers 28 and 30. The amplifiers 24 and 26 and the power supply for the satellite speakers are no longer subject to the low frequencies that will now be reproduced by the subwoofer.

Therefore it can be seen that in the first state, when the satellite speakers 28 and 30 are used by themselves, the equalization to the speakers 28 and 30 is optimized for full range operation and only the intended filters 32 and 36 are inserted into the circuit path by switches 42 and 44.

However, when a subwoofer is to be added to the circuit, and a connector is inserted into the jack 48, through the use of a switch integrated into the jack 48, the signal is rerouted to high pass filters 34 and 38 by switches 42 and 44 where the corner frequency (−3 dB point) of the high pass filter is moved to a higher frequency. This allows the satellite speakers to operate as stated earlier in the mid range and high frequency range where they are better suited. The low frequencies are fed to the subwoofer coupled to jack 48.

Clearly the switches 40 shown in FIG. 1 are intended to be diagrammatic in representation and may take the form of a number of different types of switches. They may be mechanical switches as shown, all operated by the insertion of a connector in jack 48 in a well-known manner.

However, the switches could be magnetically operated as illustrated in FIG. 2. In FIG. 2, connector 54 is part of jack 48 shown in FIG. 1 and when a connector is inserted in the jack 48, connector 54 moves a magnet 66 in close association with a Hall effect device 68 which is in effect a switch that couples the filter output from the high pass filter 34, for example, as the input to the loudspeaker amplifiers 24 or 26. In like manner, such a Hall effect switch could be operated in a reverse process. That is, it could disconnect the switch 42 from the full range filter 32 and switch 44 from full range filter 36.

In FIG. 3, an electrical device is shown as the switch, or a portion of switch device 40. In FIG. 3, input arm 54 can be the same arm 54 shown in FIG. 1 in jack 48 and could supply a voltage through contact arm 72 to an electronic device such as a MOS transistor 74. Proper voltage is supplied to the MOS 74 at terminal 76. When the switch terminals 54 and 72 are closed, the MOS may be made either to conduct or nonconduct as desired. If it is to conduct, it could couple the high pass filter 34 output on terminal 78 to the loudspeaker input on line 80 which would be coupled to the amplifiers 24 and 26, respectively, in their respective channels. One of such switches would be used to open the connection to the full range amplifier 32 and close the connection to the high pass filter 34.

FIG. 4 illustrates a general optical circuit that could be used as the switches 40 in FIG. 1. Again, the arm 54 could be the arm 54 illustrated in FIG. 1 which, when the woofer is added and the connector is inserted in jack 48, arm 54 is brought into contact with arm 82, thus supplying a voltage to a light emitting device 84 which generates a light represented by arrow 86. This light activates a photoelectric device 88 causing it to conduct and connect the input 90 to the output 92. The input 90 could be the output of the high pass filters 34 or 38 and the output 92 could be the input to the amplifiers 24 or 26 that drive the loudspeakers 28 and 30. Clearly the devices could be made to operate in the reverse direction to disconnect a full range filter from the output amplifiers 24 and 26. One skilled in the art will understand how to use each of the circuits shown in FIGS. 2, 3 and 4 to provide the proper switching arrangement 40.

Thus there has been disclosed a novel automatically switched equalization circuit where, when satellite speakers are being used by themselves and these speakers are small and inefficient and not optimum for low frequency operation and are suitable down to an effective frequency range of 200–300 Hz, the equalization of the satellite speakers is optimized for full range operation and only the intended filters for full range operation are inserted into the circuit path.

However, when the connector is inserted into an output jack to connect a subwoofer to the system, a switch, integrated into the jack or associated with the jack, reroutes the audio signals to filters that move the corner frequency of the high pass filter (−3 dB) out to a higher frequency. This allows the satellite speakers (that are normally quite small and tend to be weak and low frequency) to operate in the mid-range and high frequency range (300 Hz–20 kHz) where they are better suited. In doing this, the power dissipation in the smaller speakers is reduced dramatically due to the fact that they no longer are required to reproduce the low speakers now being fed to the subwoofer. The result is louder and clearer satellite speakers exhibiting a much lower tendency to clip the signals from the amplifier driving them. This becomes critical for a low-current wall transformer used to power the satellite amplifiers which produces a limited supply voltage and current. Due to the loading of the power supply when the amplifier reproduces low frequencies, the available output power for mid and high frequencies is substantially diminished thus causing distortion at all frequencies and inefficient use of the power supply.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. An automatically switched equalization circuit for a set of left and right channel audio loudspeakers of the mid and high frequency ranges including:

left and right channel audio input signals;

a stereo jack for receiving a connector that couples the left and right audio signals to a low frequency loudspeaker;

a switch associated with said stereo jack having first and second positions;

said first position of said switch coupling a full frequency range audio signal to the left and right channel loudspeakers;

said second position of said switch coupling only mid frequency and high frequency audio signals to said left and right channel loudspeakers; and said switch being in said first position when said low frequency range loudspeaker is unused and being automatically placed in said second position when said low frequency range loudspeaker is used and said connector is inserted into said stereo jack.

2. An automatically switched equalization circuit as in claim 1 further including:

full frequency range filters for coupling said audio signal to said left and right speakers when said switch in said first position; and high pass filters for coupling said audio signals to said left and right loudspeakers when said switch in said second position.

3. An automatically switched equalization circuit as in claim 2 further including:

a first audio amplifier in each of said left and right audio channels for amplifying said audio signals prior to being filtered by both said full frequency range filters and said high pass filters; and a second audio amplifier in each of said left and right audio signal channels prior to the corresponding left or right channel loudspeakers for amplifying either the full range audio signals or the high pass frequency audio signals as selected by said first and second switch positions.

4. An automatically switched equalization circuit as in claim 1 wherein said switch associated with said stereo jack is a Hall effect switch.

5. An automatically switched equalization circuit as in claim 1 wherein said switch associated with said stereo jack is an electronic switch.

6. An automatically switched equalization circuit as in claim 1 wherein said switch associated with said stereo jack is an optical switch.

7. An automatically switched equalization circuit as in claim 1 wherein said stereo jack is an miniature jack.

8. In a loudspeaker system having at least one loudspeaker coupled to an input audio signal through a full range audio frequency filter, the improvement including:

a high pass filter having an input for receiving said audio input signal and having an output;

an input connector for a low frequency loudspeaker, said input connector receiving said input audio signals;

a switch having an output coupled to said at least one loudspeaker and having an input for selective coupling between said full audio frequency range filter and said high pass filter output; and switch control means coupled to said switch and operated by said low frequency speaker input connector such that when a low frequency speaker is connected to said input connector, said switch couples only said high pass filter signals to said at least one loudspeaker.

9. A circuit for coupling left and right channel audio signals to a set of corresponding left and right loudspeakers, said circuit including:

a first input amplifier for each of said left and right channels for amplifying said audio signals;

an equalization circuit coupled to the output of each said first amplifiers in each of said left and right channels;

said equalization circuit providing both full range audio frequency output signals and high pass audio frequency signals for each of said left and right channels;

said left and right loudspeakers operating in the mid frequency to high frequency range;

a second amplifier having an input coupled to and receiving both of said left and right channel audio signals and generating audio output signals;

first and second single-pole double-throw switches, each switch having an output terminal coupled to a corresponding left or right loudspeaker and a first input terminal for receiving a corresponding left or right full range audio frequency output signal from said equalizer and a second input terminal for receiving a corresponding left or right high pass audio frequency signal from said equalizer;

a supplemental low frequency loudspeaker connector jack coupled to the output of said second amplifier for receiving a low frequency loudspeaker connector; and switch control means coupled to said single-pole double-throw switches and to said low frequency loudspeaker connector jack such that when a low frequency loudspeaker connector is inserted in said supplemental loudspeaker connector jack, said single-pole double-throw switches are operated to couple only high pass filter signals to said first and second loudspeakers and when said low frequency loudspeaker connector jack is not inserted in said supplemental loudspeaker connector jack, said single-pole, double-throw switches couple only full range audio frequency signals to said left and right loudspeakers.

10. A loudspeaker system including:

left and right channel audio signal input terminals;

left and right loudspeakers generally suited for handling mid to high range audio frequencies;

left and right full range filters, each having an input coupled to one of said left and right channel signal input terminals and an output normally coupled to its corresponding left or right loudspeaker;

left and right high pass frequency filters, each having an output for coupling to a corresponding one of said left and right loudspeakers and having an input coupled to one of said left and right channel signal input terminals;

a connector jack for a low frequency range loudspeaker being coupled to said left and right channel audio input signal terminals, said connector jack for receiving a low frequency range loudspeaker mating connector; and switch means coupled to said connector jack for automatically disconnecting said left and right loudspeakers from said left and right full range filters and coupling a corresponding one of said left and right high pass frequency filter outputs to corresponding ones of said left and right loudspeakers when a low frequency range loudspeaker mating connector is coupled to said connector jack so as to enable said left and right loudspeakers to operate more efficiently.

11. A loudspeaker system as in claim 10 wherein said switch means further includes:

a single-pole double-throw switch in each of said left and right audio channels;

said single-pole of each switch being connected to a corresponding one of said left and right loudspeakers;

one terminal of said double-poles of each switch being connected to a corresponding one of said outputs of said full range filters;

the other terminal of said double-poles of each switch being connected to a corresponding one of said outputs of said high pass frequency filters; and said single-pole of each said switch being moved from said one of said double-pole terminals to said other one of said double-pole terminals when said low frequency range loudspeaker mating connector is coupled to said connector jack to automatically cause only audio frequencies in the high pass range to be coupled to said left and right loudspeakers and only low audio frequencies to be coupled to said low frequency loudspeaker.

12. A loudspeaker system as in claim 11 further including an audio amplifier coupled between each audio input terminal and each full range filter and high pass filter.

13. A loudspeaker system as in claim 10 wherein said switch means includes:

a Hall effect switch having an input coupled to the output of one of said filters and an output coupled to a corresponding one of said left and right loudspeakers; and a magnet associated with said Hall effect switch and operated only when said low range loudspeaker mating connector is inserted in said connector jack to energize said Hall effect switch and effect the connection between each said high pass filter and a corresponding left or right loudspeaker.

14. A loudspeaker system as claim 10 wherein said switch includes:

an MOS device having an input coupled to the output of one said filters and output coupled to a corresponding one of said left and right loudspeakers;

a control bias connection coupled to said MOS device to operate said MOS device; and a bias voltage coupled through said connector to said control bias connection such that said MOS device is operated to effect the said coupling between said high pass filter and its corresponding left or right loudspeaker only when said low frequency range loudspeaker mating connector is inserted in said connector jack.

15. A loudspeaker system as in claim 10 wherein said switch means includes:

an optical device for each filter, each device having an input coupled to the output of one of said filters and an output coupled to a corresponding one of said left and right loudspeakers;

a light source associated with each optical device for activating said optical device to effect the connection between said filter output at its corresponding left or right speaker; and a power source coupled through said connector to control said light source only when low frequency range loudspeaker mating connector is inserted in said connector jack.

16. An automatically switched equalization circuit for a single audio loudspeaker of the mid and high frequency ranges including:

audio input signals;

a connector jack for receiving a mating connector that couples the audio signals to a low frequency range loudspeaker;

a switch associated with said connector jack and having first and second input terminals and an output terminal coupled to said single audio loudspeaker, said switch being operated between said input terminals when said mating connector is inserted in said connector jack;

said first input terminal of said switch receiving a full frequency range of audio signals for the single audio loudspeaker;

said second input terminal of said switch receiving only a mid frequency range and high frequency range of audio signals for said single audio loudspeaker; and said switch being coupled to said first terminal when said low frequency range loudspeaker is unused and being coupled to said second terminal when said low frequency range loudspeaker is used and said mating connector is inserted in said connector jack.

* * * * *